United States Patent
Song (10) Patent No.: US 8,995,213 B2
(45) Date of Patent: Mar. 31, 2015

(54) NONVOLATILE MEMORY DEVICE AND OPERATING METHOD THEREOF

(71) Applicant: SK Hynix Inc., Icheon-si Gyeonggi-do (KR)

(72) Inventor: In Hwan Song, Icheon-si (KR)

(73) Assignee: SK Hynix Inc., Gyeonggi-do (KR)

(*) Notice: Subject to any disclaimer, the term of this patent is extended or adjusted under 35 U.S.C. 154(b) by 336 days.

(21) Appl. No.: 13/711,869

(22) Filed: Dec. 12, 2012

(65) Prior Publication Data

US 2014/0063998 A1     Mar. 6, 2014

(30) Foreign Application Priority Data

Sep. 3, 2012   (KR) .................... 10-2012-0096897

(51) Int. Cl.
- *G11C 29/00* (2006.01)
- *G11C 29/50* (2006.01)
- *G11C 16/34* (2006.01)

(52) U.S. Cl.
CPC ........ *G11C 29/50016* (2013.01); *G11C 16/349* (2013.01)
USPC .................... 365/201; 365/189.07; 365/185.2

(58) Field of Classification Search
CPC .......... G11C 16/3459; G11C 16/0408; G11C 16/349
USPC .................. 365/201, 189.07, 185.2
See application file for complete search history.

(56) References Cited

U.S. PATENT DOCUMENTS

| | | | | |
|---|---|---|---|---|
| 2008/0158989 A1* | 7/2008 | Wan et al. | ................. | 365/185.22 |
| 2008/0158990 A1* | 7/2008 | Wan et al. | ................. | 365/185.22 |
| 2010/0238724 A1* | 9/2010 | Fukuda | .................... | 365/185.03 |

FOREIGN PATENT DOCUMENTS

| | | |
|---|---|---|
| KR | 1020100046530 A | 5/2010 |
| KR | 1020110078726 A | 7/2011 |

\* cited by examiner

*Primary Examiner* — Tuan T Nguyen (74) *Attorney, Agent, or Firm* — William Park & Associates Patent Ltd.

(57) ABSTRACT

A nonvolatile memory device includes a memory cell array including a main cell area and a retention flag cell area, a retention check unit configured to compare a read result for retention flag cells included in the retention flag cell area to a reference value, and determine a retention state of the retention flag cells according to a comparison result, and a control logic configured to provide a retention check result based on the retention state to the external device in response to a retention check request provided from an external device.

20 Claims, 9 Drawing Sheets

NONVOLATILE MEMORY DEVICE AND OPERATING METHOD THEREOF

CROSS-REFERENCES TO RELATED APPLICATION

The present application claims priority under 35 U.S.C. §119(a) to Korean application number 10-2012-0096897, filed on Sep. 3, 2012, in the Korean Intellectual Property Office, which is incorporated herein by reference in its entirety.

BACKGROUND

1. Technical Field

The present invention relates generally to a semiconductor memory device, and more particularly, to a nonvolatile memory device and an operating method thereof.

2. Related Art

A semiconductor memory device is typically classified as a volatile memory device or a nonvolatile memory device. The volatile memory device loses data stored therein when power supply is cut off, but the nonvolatile memory device maintains data stored therein even when a power supply is not supplied. The nonvolatile memory device may include various types of memory cells.

The nonvolatile memory device may be classified as a flash memory device, a ferroelectric RAM (FRAM) using a ferroelectric capacitor, a magnetic RAM (MRAM) using a tunneling magneto-resistive (TMR) layer, a phase change memory device using chalcogenide alloys and the like, depending on the structure of memory cells.

Among the nonvolatile memory devices, the flash memory device is roughly classified into a NOR flash memory device or a NAND flash memory device, depending on the connection state between memory cells and a bit line. Since the NOR flash memory device has a structure in which two or more memory cell transistors are connected in parallel to one bit line, it exhibits excellent random access time properties. On the other hand, the NAND flash memory device has a structure in which two or more memory cell transistors are connected in series to one bit line. Such a structure is referred to as a cell string, and one bit line contact is required per cell string. Due to the structure, the NAND flash memory device exhibits excellent properties in terms of the degree of integration.

When a program operation is performed on a memory cell of the nonvolatile memory device, the memory cell traps charges. In other words, the programmed memory cell stores charges. The longer time elapses or the read number of the memory cell increases after a memory cell is programmed, the more the memory cell deteriorates. When the memory cell deteriorates, the charges stored in the memory cell may flow out of the memory cell, even though the memory cell has nonvolatile memory properties. When the stored charges flow out of the memory cell, the reliability of data cannot be guaranteed. The characteristic of retaining stored charges within a predetermined specification is referred to as the retention characteristic of a memory cell, and since a memory cell of which the retention characteristic is degraded cannot maintain a programmed state, a read fail may occur.

SUMMARY

A nonvolatile memory device capable of indicating a retention state and an operating method thereof are described herein.

In an embodiment of the present invention, a nonvolatile memory device includes: a memory cell array including a main cell area and a retention flag cell area; a retention check unit configured to compare a read result for retention flag cells included in the retention flag cell area to a reference value, and determine a retention state of the retention flag cells according to a comparison result; and a control logic configured to provide a retention check result based on the retention state to the external device in response to a retention check request provided from an external device.

In another embodiment of the present invention, an operating method of a nonvolatile memory device including main cells and retention flag cells includes the steps of: receiving a retention check request to check retention state of the retention flag cells; performing a read operation on the retention flag cells in response to the retention check request; comparing a number of retention fail bits, calculated on the basis of the result of the performed read operation, to a reference value; and outputting retention state information based on the comparison result.

BRIEF DESCRIPTION OF THE DRAWINGS

Features, aspects, and embodiments are described in conjunction with the attached drawings, in which.

DETAILED DESCRIPTION

Hereinafter, a nonvolatile memory device and an operating method thereof according to the present invention will be described below with reference to the accompanying drawings through various embodiments.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Figure 1:
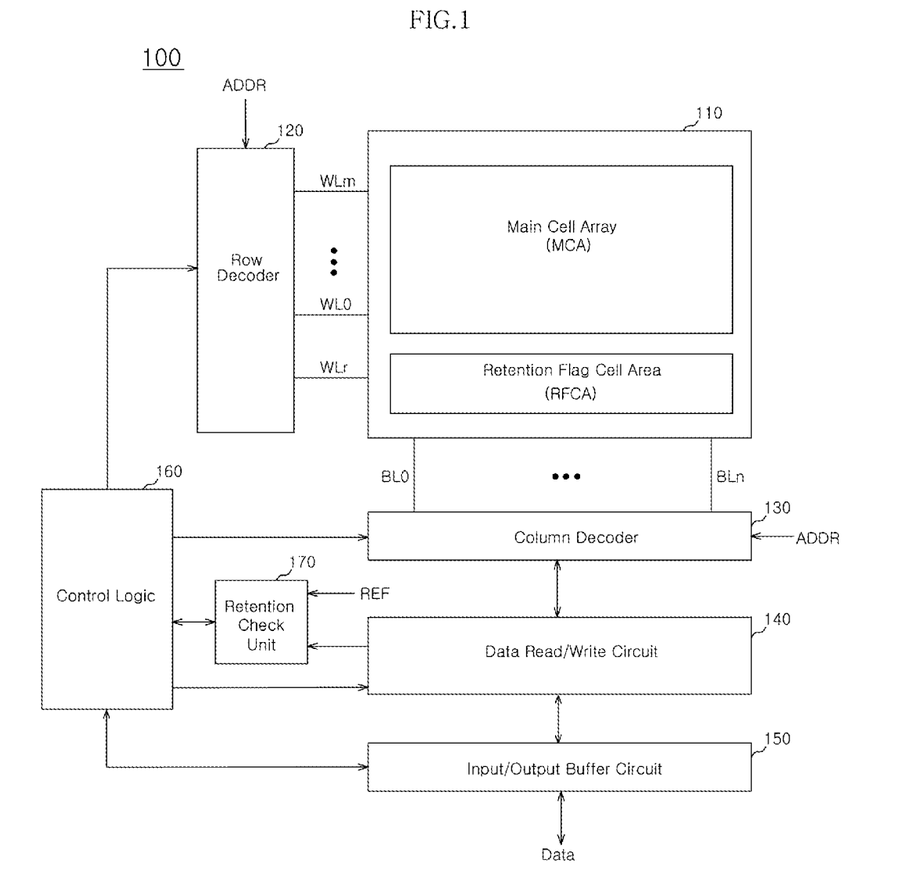
FIG. 1 is a block diagram illustrating a nonvolatile memory device according to an embodiment of the present invention.

FIG. 1 is a block diagram illustrating a nonvolatile memory device according to an embodiment of the present invention. Referring to FIG. 1, the nonvolatile memory device 100 includes a memory cell array 110, a row decoder 120, a column decoder 130, a data read/write circuit 140, an input/output buffer circuit 150, a control logic 160, and a retention check unit 170.

The memory cell array 110 includes a main cell area MCA and a retention flag cell area RFCA. The main cell area MCA includes a plurality of memory cells for storing data provided from an external device (not illustrated). The retention flag cell area RFCA includes a plurality of memory cells for determining retention states of the memory cells of the main cell area MCA.

In order to determine the retention states of the memory cells included in the main cell area MCA, the memory cells included in the retention flag cell area RFCA may have the same structure as the memory cells included in the main cell area MCA. In addition, the memory cells included in the retention flag cell area RFCA may be programmed while the memory cells included in the main cell area MCA are being programmed. The memory cells included in the retention flag cell area RFCA may also be programmed in a substantially similar manner as a program method of the memory cells included in the main cell area MCA. For example, each of the memory cells may store one-bit data, thusly referred to as a single level cell (SLC), and may be programmed in such a manner as to have a threshold voltage corresponding to an erase state and one program state. As another example, each of the memory cells may store two or more bits of data, thusly referred to as a multi-level cell (MLC). The MLC is programmed in such a manner as to have a threshold voltage corresponding to an erase state and any one of a plurality of program states.

The memory cells included in the main cell area MCA and the retention flag cell area RFCA may be read in different manners. For example, a read voltage applied to the memory cells included in the main cell area MCA and the application number of the read voltage may differ from a read voltage applied to the memory cells included in the retention flag cell area RFCA and the application number of the read voltage. The read voltage applied to the memory cells included in the retention flag cell area RFCA and the application number of the read voltage controlled by the control logic 160 will be described in detail with reference to FIG. 3.

The row decoder 120 is operated according to the control of the control logic 160 and is connected to the memory cell array 110 through a plurality of word lines WL0 to WLm. The row decoder 120 is configured to decode an address ADDR which is input externally. The row decoder 120 is configured to selectively drive the word lines WL0 to WLm according to the decoding result. For example, the row decoder 120 may provide a select voltage (program voltage or read voltage) to a selected word line, and provide an unselect voltage (pass voltage) to an unselected word line.

The column decoder 130 is operated according to the control of the control logic 160 and is connected to the memory cell array 110 through a plurality of bit lines BL0 to BLn. The column decoder 130 is configured to decode the address ADDR. The column decoder 130 is configured to sequentially connect the bit lines BL0 to BLn to the data read/write circuit 140 by a predetermined unit according to the decoding result.

The data read/write circuit 140 is operated according to the control of the control logic 160. The data read/write circuit 140 is configured to operate as a write driver or sense amplifier depending on an operation mode. For example, the data read/write circuit 140 is configured to store data inputted through the input/output buffer circuit 150 in a memory cell of the memory cell array 110 during a program operation. The data read/write circuit 140 is configured to output data read from a memory cell of the memory cell array 110 to the input/output buffer circuit 150 during a read operation.

The data read/write circuit 140 may include a plurality of data read/write circuits RWC0 to RWCn (not shown) corresponding to the respective bit lines BL0 to BLn (or bit line pairs). For this reason, the bit lines BL0 to BLn (or bit line pairs) may be selected or controlled by the corresponding data read/write circuits RWC0 to RWCn, respectively.

The input/output buffer circuit 150 is configured to receive data from an external device (for example, a memory controller, a memory interface, a host device or the like) or output data to the external device. For these operations, the input/output buffer circuit 150 may include a data latch circuit (not shown) and an output driving circuit (not shown).

The control logic 160 is configured to control overall operations of the nonvolatile memory device 100 in response to a control signal provided from the external device. For example, the control logic 160 may control read, program (or write), and erase operations of the nonvolatile memory device 100. The control logic 160 is configured to control a retention check operation in response to a retention check requested from the external device. For example, the control logic 160 may control the memory cells included in the retention flag cell area RFCA to be programmed when the memory cells included in the main cell area MCA are programmed. The control logic 160 may control the retention check unit 170 to perform a retention read operation on the memory cells included in the retention flag cell area RFCA. The control logic 160 may provide a retention check result provided through the retention check unit 170 to the external device.

The retention check unit 170 is configured to perform a retention check operation according to the control of the control logic 160. For example, the retention check unit 170 may compare pass/fail results of retention flag cells, determined through the data read/write circuit 140, to a reference value REF, when a retention read voltage is applied to the retention flag cells. The retention check unit 170 may provide a result value indicating a retention fail or a result value indicating a retention pass to the control logic 160, according to the comparison result.

Figure 2:
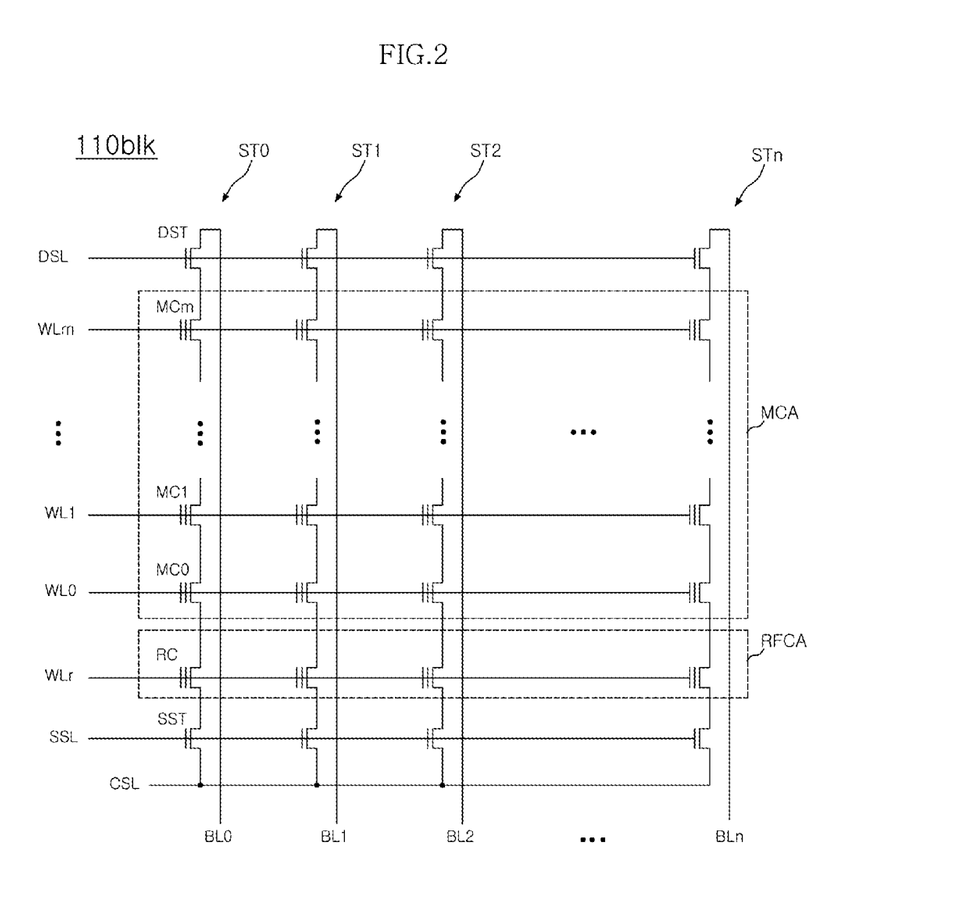
FIG. 2 is a circuit diagram illustrating one memory block included in a memory cell array according to an embodiment of the present invention.

FIG. 2 is a circuit diagram illustrating one memory block included in the memory cell array according to an embodiment of the present invention. For convenience of description, FIG. 2 illustrates one memory block 110*blk* included in the memory cell array 110 of FIG. 1.

The memory block 110*blk* includes a main cell area MCA, which is an area for storing data provided externally within the nonvolatile memory device 100 of FIG. 1. Although not illustrated, the main cell area MCA may include a main area and a spare area. The main area is where user data provided externally within the nonvolatile memory device 100 are stored. The spare area is where supplemental information related to the user data stored in the main area, for example, meta data such as an error correction code, are stored.

The memory block 110*blk* also includes a retention flag cell area RFCA, which is an area for storing retention check data. The retention check data may include any one of or a combination of program states of the memory cells included in the main cell area MCA.

The retention flag cell area RFCA may be programmed while the main cell area MCA is being programmed. For this reason, the retention characteristic of the main cell area MCA may be determined through the retention flag cell area RFCA. The retention flag cell area RFCA may also be programmed regardless of whether the main cell area MCA is programmed or not.

For convenience of description, FIG. 2 illustrates that the main cell area MCA and the retention flag cell area RFCA are included in the memory block 110*blk*. However, the retention flag cell area RFCA may be configured as a memory block separated from the main cell area MCA.

The memory block 110*blk* includes a plurality of cell strings ST0 to STn connected to the plurality of bit lines BL0 to BLn. The cell strings ST0 to STn have the same circuit configuration. The following descriptions will be focused on one cell string ST0, for convenience of description.

The cell string ST0 includes a plurality of memory cells MC0 to MCm, a retention flag cell RC, and select transistors DST and SST, which are connected between the bit line BL0 and a common source line CSL. For example, the cell string ST0 may include a drain select transistor DST connected to a drain select line DSL, a plurality of memory cells MC0 to MCm connected to a plurality of word lines WL0 to WLm, respectively, a retention flag cell RC connected to a retention word line WLr, and a source select transistor SST connected to a source select line SSL.

Between the source select transistor SST and the memory cell MC0, the retention flag cell RC may be connected. Although not illustrated, another retention flag cell RC may be connected between the drain select transistor DST and the memory cell MCm. FIG. 2 illustrates the cell string ST0 including one retention flag cell RC, but additional retention flag cells may be included in the cell string ST0.

The retention flag cell RC has the same structure as the memory cells MC0 to MCm. However, the retention flag cell RC is not used as a storage element for storing user data provided externally within the nonvolatile memory device 100, unlike the memory cells MC0 to MCm. That is, the retention flag cell area RFCA is a hidden area which a user cannot access.

Figure 3:
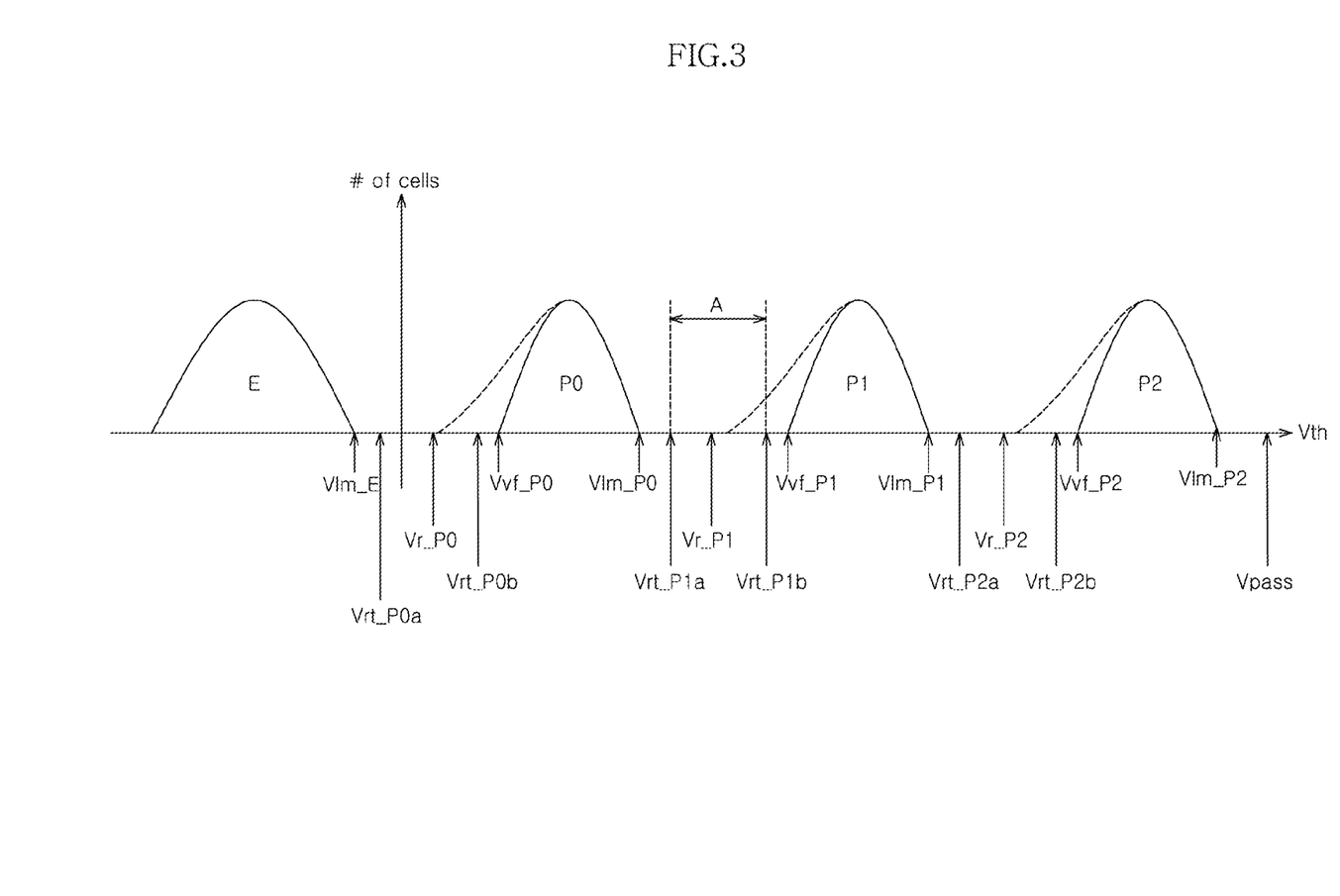
FIG. 3 is a diagram showing a retention check method according to an embodiment of the present invention, illustrating threshold voltage distributions and read voltages of memory cells.

FIG. 3 is a diagram to show a retention check method according to an embodiment of the present invention, illustrating threshold voltage distributions and read voltages of memory cells. In FIG. 3, suppose that a memory cell forming the memory cell array 110 of FIG. 1 is an MLC capable of storing two-bit data, for convenience of description.

The MLC that stores two-bit data is programmed or erased to have any one of an erase state E and a plurality of program states P1 to P3. In order to secure a distribution margin between the respective states of the memory cell or determine whether a program or erase operation was completed or not, a program verify operation is performed during the program operation, or an erase verify operation is performed during the erase operation.

During the program verify operation, program verify voltages Vvf_P0, Vvf_P1, and Vvf_P2 are provided to a selected word line. The first program verify voltage Vvf_P0 is a verify voltage for programming a memory cell into the first program state P0. The second program verify voltage Vvf_P1 is a verify voltage for programming a memory cell into the second program state P1. The third program very voltage Vvf_P2 is a verify voltage for programming a memory cell into the third program state P2. During the erase verify operation, an erase verify voltage Vlm_E is provided to the selected word line. The erase verify voltage Vlm_E is a verify voltage for erasing a memory cell into the erase state E.

When the program operation is completed, the selected memory cell may be programmed into the first program state P0 having a threshold voltage between the first program verify voltage Vvf_P0 and a first program limit voltage Vlm_P0, the second program state P1 having a threshold voltage between the second program verify voltage Vvf_P1 and a second program limit voltage Vlm_P1, and the third program state P2 having a threshold voltage between the third program verify voltage Vvf_P2 and a third program limit voltage Vlm_P2. When the erase operation is completed, the selected memory cell may be erased in the erase state E having a threshold voltage less than or equal to the erase verify voltage Vlm_E.

During the read operation, any one of select read voltages Vr_P0, Vr_P1, and Vr_P2 is provided to the selected word line, and an unselect read voltage Vpass is provided to an unselected word line. The first select read voltage Vr_P0 has a voltage level between the erase state E and the first program state P0. The second select read voltage Vr_P1 has a voltage level between the first program state P0 and the second program state P1. The third select read voltage Vr_P2 has a voltage level between the second program state P1 and the third program state P2.

When the first select read voltage Vr_P0 is applied, a memory cell having a threshold voltage corresponding to the erase state E becomes an on cell, and a memory cell having a threshold voltage corresponding to any one of the first to third program states P0 to P2 becomes an off cell. When the second select read voltage Vr_P1 is applied, a memory cell having a threshold voltage corresponding to the erase state E and the first program state P0 becomes an on cell, and a memory cell having a threshold voltage corresponding to any one of the second and third program states P1 and P2 becomes an off cell. When the third select read voltage Vr_P2 is applied, a memory cell having a threshold voltage corresponding to the erase state E, the first program state P0, and the second program state P1 becomes an on cell, and a memory cell having a threshold voltage corresponding to the third program state P2 becomes an off cell.

When a retention characteristic in which the threshold voltage of a memory cell is retained is degraded, the threshold voltage of the memory cell may gradually decrease. For example, as indicated by the dotted lines of FIG. 3, the threshold voltage of the memory cell is not retained at an original threshold voltage, but may gradually decrease. When the threshold voltage of the memory cell decreases, the memory cell which is to be recognized as an off cell may be recognized as an on cell. According to an embodiment of the present invention, the retention characteristic of the memory cell may be determined through a retention check operation to prepare for a retention fail. Therefore, the reliability of the nonvolatile memory device 100 may be improved.

During the retention check operation, a retention read operation is performed on the retention flag cell. A retention read voltage applied to the retention flag cell during the retention read operation is different from a select read voltage applied to a selected memory cell during a general read operation. For example, when the retention flag cell is programmed into the first program state P0, two or more retention read voltages Vrt_P0a and Vrt_P0b are provided to a retention word line WLr of FIG. 2. When the retention flag cell is programmed into the second program state P1, two or more retention read voltages Vrt_P1a and Vrt_P1b are provided to the retention word line WLr. When the retention flag cell is programmed into the third program state P2, two or more retention read voltages Vrt_P2a and Vrt_P2b are provided to the retention word line WLr.

The retention read voltage Vrt_P0a for performing a retention read operation on the first program state P0 is higher than the erase verify voltage Vlm_E and lower than the first select read voltage Vr_P0. The retention read voltage Vrt_P0b for performing a retention read operation on the first program state P0 is higher than the first select read voltage Vr_P0 and lower than the first program verify voltage Vvf_P0.

The retention read voltage Vrt_P1a for performing a retention read operation on the second program state P1 is higher than the first program limit voltage Vlm_P0 and lower than the second select read voltage Vr_P1. The retention read voltage Vrt_P1b for performing a retention read operation on the second program state P2 is higher than the second select read voltage Vr_P1 and lower than the second program verify voltage Vvf_P1.

The retention read voltage Vrt_P2a for performing a retention read operation on the third program state P2 is higher than the second program limit voltage Vlm_P1 and lower than the third select read voltage Vr_P2. The retention read voltage Vrt_P2b for performing a retention read operation on the third program state P2 is higher than the third select read voltage Vr_P2 and lower than the third program verify voltage Vvf_P2.

Figure 4:
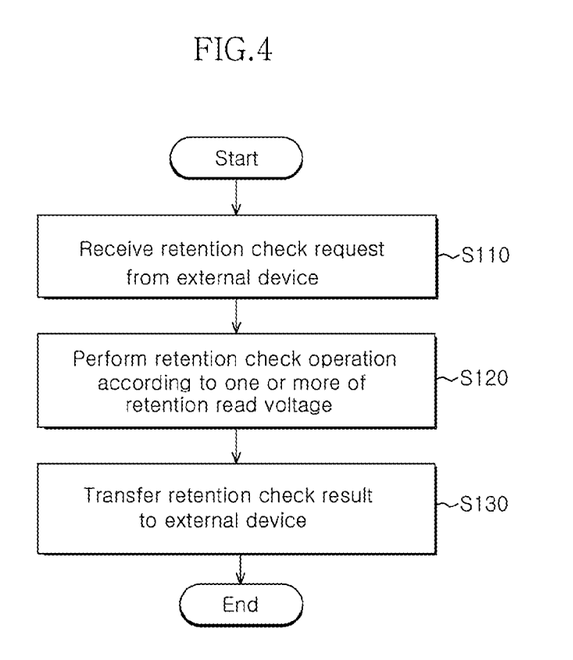
FIG. 4 is a flow chart showing a retention check operation according to an embodiment of the present invention.

FIG. 4 is a flow chart showing the retention check operation according to an embodiment of the present invention. In FIG. 4, suppose that the memory cells included in the retention flag cell area RFCA of the nonvolatile memory device 100 are programmed regardless of when the memory cells included in the main cell area MCA are programmed or whether the memory cells included in the main cell area MCA are programmed or not, before the retention check operation is performed.

At step S110, the nonvolatile memory device 100 receives a retention check request from an external device (for example, a host, a memory controller or the like). The external device may provide a specific command to the nonvolatile memory device 100, in order to request a retention check.

At step S120, the nonvolatile memory device 100 performs a retention check operation according to a retention read voltage. Step S120 will be described as follows.

Two or more retention read voltages corresponding to one program state are applied to a retention word line so as to read retention flag cells. When the retention flag cells are programmed in different program states, two or more retention read voltages corresponding to the respective program states are applied to the retention word line. Accordingly, the retention flag cells may be repetitively read.

For example, suppose that the retention flag cells are programmed in the second program state P1 of FIG. 3. When the retention flag cells are read according to the first retention read voltage Vrt_P1b corresponding to the second program state P1, whether the read operations for the retention flag cells passed or failed is determined. Additionally, when the retention flag cells are read according to the second retention read voltage Vrt_P1a lower than the first retention read voltage Vrt_P1b, whether the read operations for the retention flag cells passed or failed is determined.

When the number of retention flag cells of which the read operations failed according to the second retention read voltage Vrt_P1a is subtracted from the number of retention flag cells of which the read operations passed according to the first retention read voltage Vrt_P1b, the number of retention flag cells having a threshold voltage between the first and second retention read voltages Vrt_P1b and Vrt_P1a is calculated (area A of FIG. 3). When the number of retention flag cells having a threshold voltage between the first and second retention read voltages Vrt_P1b and Vrt_P1a, that is, the number of retention flag cells positioned in the area A, is larger than the reference value, the retention check operation is determined as a fail. When the number of retention flag cells having a threshold voltage between the first and second retention read voltages Vrt_P1b and Vrt_P1a, that is, the number of retention flag cells positioned in the area A, is smaller than the reference value, the retention check operation is determined as a pass.

At step S130, the nonvolatile memory device 100 transmits the retention check result to the external device. Specifically, the nonvolatile memory device 100 transmits information on whether the retention check operation passed or failed, to the external device.

Figure 5:
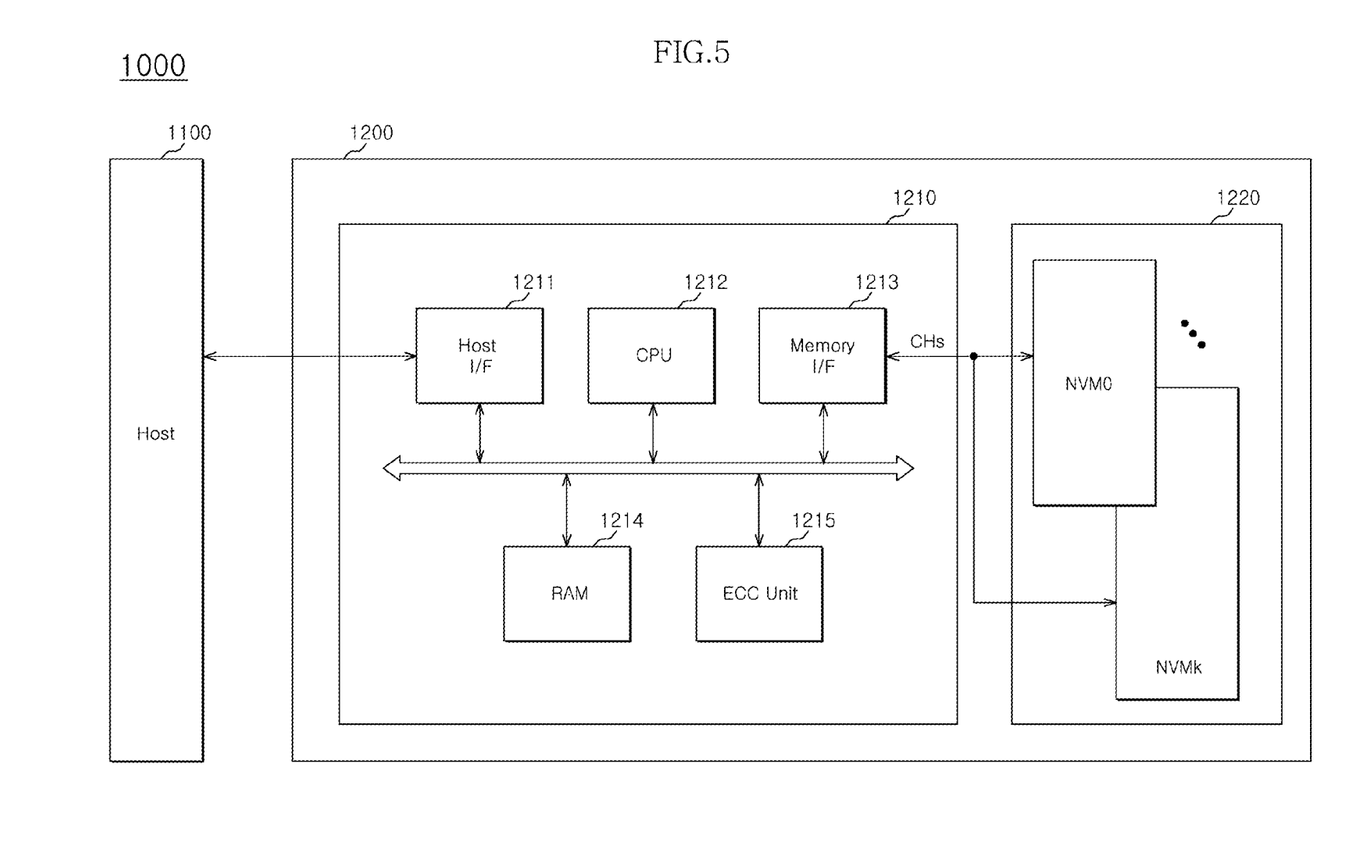
FIG. 5 is a block diagram illustrating a data processing system including the nonvolatile memory device according to an embodiment of the present invention.

FIG. 5 is a block diagram illustrating a data processing system including the nonvolatile memory device according to an embodiment of the present invention. Referring to FIG. 5, the data processing system 1000 includes a host 1100 and a data storage device 1200. The data storage device 1200 includes a controller 1210 and a data storage medium 1220. The data storage device 1200 may be connected to the host 1100 such as a desktop computer, a notebook computer, a digital camera, a mobile phone, an MP3 player, a game machine or the like. The data storage device 1200 is also referred to as a memory system.

The controller 1210 is coupled to the host 1100 and the data storage medium 1220. The controller 1210 is configured to access the data storage medium 1220 in response to a request from the host 1100. For example, the controller 1210 is configured to control a read, program, or erase operations of the data storage medium 1220. The controller 1210 is configured to drive firmware for controlling the data storage medium 1220.

The controller 1210 may include well-known components such as a host interface 1211, a central processing unit (CPU) 1212, a memory interface 1213, a RAM 1214, and an error correction code (ECC) unit 1215.

The CPU 1212 is configured to control overall operations of the controller 1210 in response to a request from the host. The RAM 1214 may be used as a working memory of the CPU 1212, and may temporarily store data read from the data storage medium 1220 or data provided from the host 1100.

The host interface 1211 is configured to interface the host 1100 and the controller 1210, and may be configured to communicate with the host 1100 through one of a USB (Universal Serial Bus) protocol, a MMC (Multimedia Card) protocol, a PCI (Peripheral Component Interconnection) protocol, a PCI-E (PCI-Express) protocol, a PATA (Parallel Advanced Technology Attachment) protocol, a SATA (Serial ATA) protocol, an SCSI (Small Computer System Interface) protocol, and an IDE (Integrated Drive Electronics) protocol.

The memory interface 1213 is configured to interface the controller 1210 and the data storage medium 1220 by providing a command and address to the data storage medium 1220 and exchanging data with the data storage medium 1220.

The data storage medium 1220 may be configured with the nonvolatile memory device 100 of FIG. 1 according to an embodiment of the present invention. The data storage medium 1220 may include a plurality of nonvolatile memory devices NVM0 to NVMk. As the data storage medium 1220 is configured with the nonvolatile memory device 100 according to an embodiment of the present invention, the controller 1210 may request a retention check to the data storage medium 1220, and the data storage medium 1220 may transmit a retention check result to the controller 1210.

The ECC unit 1215 is configured to detect an error of the data read from the data storage medium 1220 and to correct the detected error, when the detected error falls within a correction range. The ECC unit 1215 may be provided inside or outside the controller 1210 depending on the memory system 1000.

The controller 1210 and the data storage medium 1220 may be integrated to form a solid state drive (SSD).

As another example, the controller 1210 and the data storage medium 1220 may be integrated into one semiconductor device to form a memory card, particularly a PCMCIA (personal computer memory card international association) card, a CF (compact flash) card, a smart media card, a memory stick, a multi-media card (MMC, RS-MMC, or MMC-micro), an SD (secure digital) card (SD, Mini-SD, or Micro-SD), or a UFS (universal flash storage) card.

As another example, the controller 1210 or the data storage medium 1220 may be mounted in various types of packages, particularly package on package (POP), ball grid arrays (BGAs), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat package (MQFP), thin quad flat package (TQFP), small outline IC (SOIC), shrink small outline package (SSOP), thin small outline package (TSOP), thin quad flat package (TQFP), system in package (SIP), multi-chip package (MCP), wafer-level fabricated package (WFP), and wafer-level processed stack package (WSP).

Figure 6:
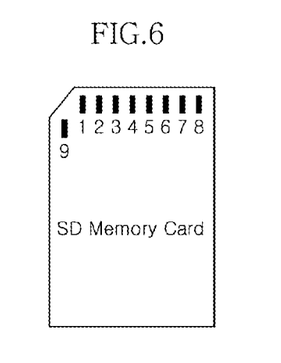
FIG. 6 illustrates a memory card including the nonvolatile memory device according to an embodiment of the present invention.

FIG. 6 illustrates a memory card including the nonvolatile memory device according to an embodiment of the present invention. FIG. 6 illustrates the exterior of an SD (secure digital) card among memory cards.

Referring to FIG. 6, the SD card includes one command pin (for example, second pin), one clock pin (for example, fifth pin), four data pins (for example, first, seventh, eighth, and ninth pins), and three power supply pins (for example, third, fourth, and sixth pins).

Through the command pin (second pin), a command and a response signal are transmitted. In general, the command is transmitted to the SD card from a host, and the response signal is transmitted to the host from the SD card.

The data pins (first, seventh, eighth, and ninth pins) are divided into receive (Rx) pins for receiving data transmitted from the host and transmit (Tx) pins for transmitting data to the host. The Rx pins and the Tx pins, respectively, form a pair to transmit differential signals.

The SD card may include the nonvolatile memory device 100 of FIG. 1 according to an embodiment of the present invention and a controller for controlling the nonvolatile memory device. The controller included in the SD card may have the same configuration and function as the controller 1210 described with reference to FIG. 5. As the SD card includes the nonvolatile memory device 100 according to an embodiment of the present invention, the controller may request a retention check to the nonvolatile memory device, and the nonvolatile memory device may transmit a retention check result to the controller, as shown in FIG. 4.

Figure 7:
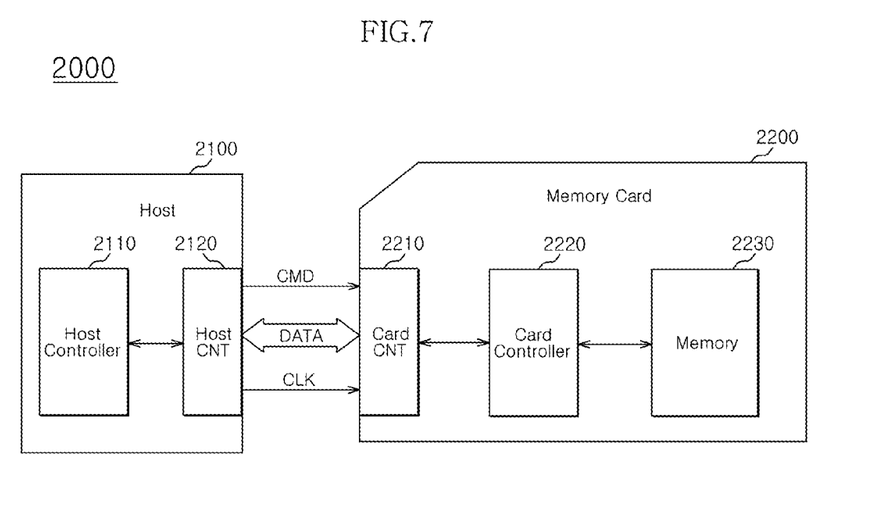
FIG. 7 is a block diagram illustrating the internal configuration of the memory card of FIG. 6 and the connection relation between the memory card and a host.

FIG. 7 is a block diagram illustrating the internal configuration of the memory card of FIG. 6 and the connection relation between the memory card and a host. Referring to FIG. 7, the data processing system 2000 includes a host 2100 and a memory card 2200. The host 2100 includes a host controller 2110 and a host connection unit 2120. The memory card 2200 includes a card connection unit 2210, a card controller 2220, and a memory device 2230.

The host connection unit 2120 and the card connection unit 2210 include a plurality of pins. The pins may include a command pin, a clock pin, a data pin, and a power supply pin. The number of pins may differ depending on the type of the memory card 2200.

The host 2100 stores data in the memory card 2200 or reads data stored in the memory card 2200.

The host controller 2110 transmits a write command CMD, a clock signal CLK generated from a clock generator (not illustrated) inside the host 2100, and data DATA to the memory card 2200 through the host connection unit 2120. The card controller 2220 operates in response to the write command received through the card connection unit 2210. The card controller 2220 stores the received data DATA in the memory device 2230, using a clock signal generated from a clock generator (not illustrated) inside the card controller 2220, according to the received clock signal CLK.

The host controller 2110 transmits a read command CMD and the clock signal CLK generated from the clock generator inside the host device 2100 to the memory card 2200 through the host connection unit 2120. The card controller 2220 operates in response to the read command received through the card connection unit 2210. The card controller 2220 reads data from the memory device 2230 using the clock signal generated from the clock generator inside the card controller 2220, according to the received clock signal CLK, and transmits the read data to the host controller 2110.

Figure 8:
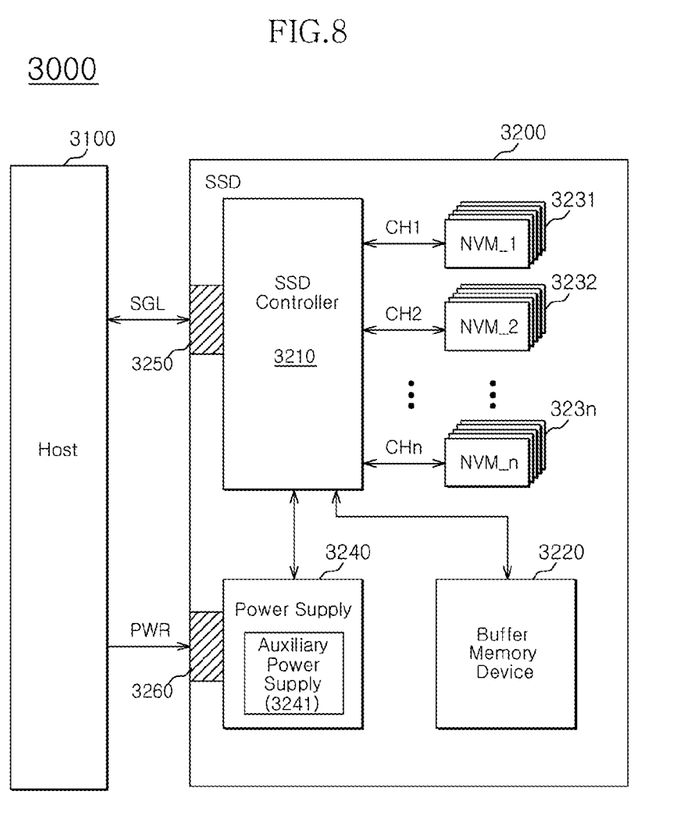
FIG. 8 is a block diagram illustrating an SSD including the nonvolatile memory device according to an embodiment of the present invention.

FIG. 8 is a block diagram illustrating an SSD including the nonvolatile memory device according to an embodiment of the present invention. Referring to FIG. 8, a data processing system 3000 includes a host 3100 and an SSD 3200.

The SSD 3200 includes an SSD controller 3210, a buffer memory device 3220, a plurality of nonvolatile memory devices 3231 to 323n, a power supply 3240, a signal connector 3250, and a power connector 3260.

The SSD 3200 operates in response to a request from the host device 3100. Particularly, the SSD controller 3210 is configured to access the nonvolatile memory devices 3231 to 323n in response to a request from the host 3100. For example, the SSD controller 3210 is configured to control read, program, and erase operations of the nonvolatile memory devices 3231 to 323n.

The buffer memory device 3220 is configured to temporarily store data which are to be stored in the nonvolatile memory devices 3231 to 323n, and is configured to temporarily store data read from the nonvolatile memory devices 3231 to 323n. The data temporarily stored in the buffer memory device 3220 are transmitted to the host 3100 or the nonvolatile memory devices 3231 to 323n, according to the control of the SSD controller 3210.

The nonvolatile memory devices 3231 to 323n are used as storage media of the SSD 3200. Each of the nonvolatile memory devices 3231 to 323n may include the nonvolatile memory device 100 of FIG. 1 according to an embodiment of the present invention. As each of the nonvolatile memory device 3231 to 323n is configured with the nonvolatile memory device 100 according to an embodiment of the present invention, the SSD controller 3210 may request a retention check to the nonvolatile memory devices 3231 to 323n, and the nonvolatile memory devices 3231 to 323n may transmit a retention check result to the controller 1210, as shown in FIG. 4.

The nonvolatile memory devices 3231 to 323n are connected to the SSD controller 3210 through a plurality of channels CH1 to CHn, respectively. One channel may be connected to one or more nonvolatile memory devices. The nonvolatile memory devices connected to one channel may be connected to the same signal bus and data bus.

The power supply 3240 is configured to provide power PWR inputted through the power connector 3260 into the SSD 3200. The power supply 3240 includes an auxiliary power supply 3241, which is configured to supply power to normally terminate the SSD 3200, when sudden power off occurs. The auxiliary power supply 3241 may include super capacitors capable of storing the power PWR.

The SSD controller 3210 is configured to exchange signals SGL with the host 3100 through the signal connector 3250. The signals SGL may include commands, addresses, data and the like. The signal connector 3250 may include a connector such as PATA (Parallel Advanced Technology Attachment), SATA (Serial Advanced Technology Attachment), SCSI (Small Computer System Interface), or SAS (Serial SCSI), according to the interface method between the host 3100 and the SSD 3200.

Figure 9:
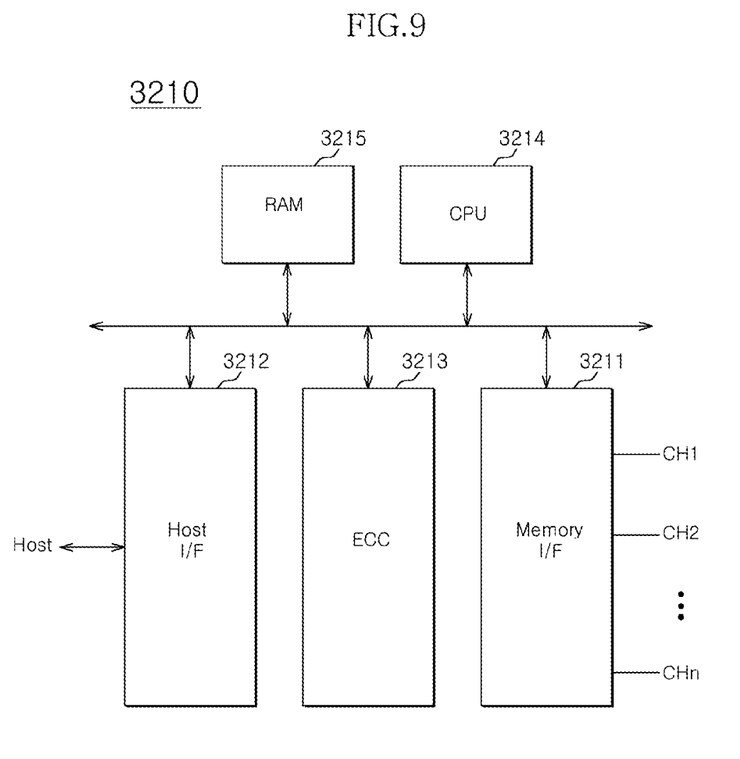
FIG. 9 is a block diagram illustrating an SSD controller of FIG. 8.

FIG. 9 is a block diagram illustrating the SSD controller of FIG. 8. Referring to FIG. 9, the SSD controller 3210 includes a memory interface 3211, a host interface 3212, an ECC unit 3213, a CPU 3214, and a RAM 3215.

The memory interface 3211 is configured to provide a command and address to the nonvolatile memory devices 3231 to 323n and to exchange data with the nonvolatile memory devices 3231 to 323n. The memory interface 3211 may scatter data transmitted from the buffer memory device 3220 over the respective channels CH1 to CHn, according to the control of the CPU 3214. The memory interface 3211 transmits data read from the nonvolatile memory devices 3231 to 323n to the buffer memory device 3220, according to the control of the CPU 3214.

The host interface 3212 is configured to provide an interface with the SSD 3200 in response to the protocol of the host 3100. For example, the host interface 3212 may be configured to communicate with the host 3100 through one of PATA (Parallel Advanced Technology Attachment), SATA (Serial Advanced Technology Attachment), SCSI (Small Computer System Interface), SAS (Serial SCSI) protocols. The host interface 3212 may perform a disk emulation function of supporting the host 3100 to recognize the SSD 3200 as a hard disk drive (HDD).

The ECC unit 3213 is configured to generate parity bits based on the data transmitted to the nonvolatile memory devices 3231 to 323n. The generated parity bits may be stored in spare areas of the nonvolatile memory devices 3231 to 323n. The ECC unit 3213 is configured to detect an error of data read from the nonvolatile memory devices 3231 to 323n. When the detected error falls within a correction range, the ECC unit 3213 may correct the detected error.

The CPU 3214 is configured to analyze and process a signal SGL inputted from the host 3100. The CPU 3214 controls overall operations of the SSD controller 3210 in response to a request from the host 3100. The CPU 3214 controls the operations of the buffer memory device 3220 and the nonvolatile memory devices 3231 to 323n according to firmware for driving the SSD 3200. The RAM 3215 is used as a working memory device for driving the firmware.

Figure 10:
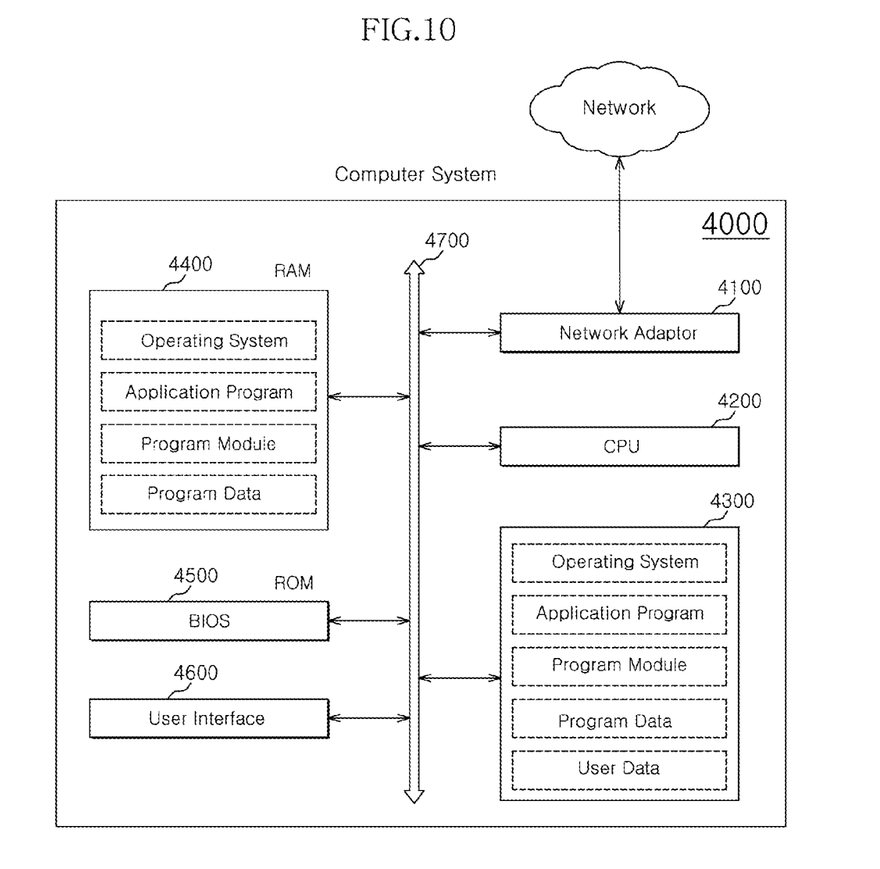
FIG. 10 is a block diagram illustrating a computer system in which a data storage device having the nonvolatile memory device according to an embodiment of the present invention is mounted.

FIG. 10 is a block diagram illustrating a computer system in which a data storage device having the nonvolatile memory device according to an embodiment of the present invention is mounted. Referring to FIG. 10, the computer system 4000 includes a network adapter 4100, a CPU 4200, a data storage device 4300, a RAM 4400, a ROM 4500, and a user interface 4600, which are electrically connected to the system bus 4700. The data storage device 4300 may include the data storage device 1200 illustrated in FIG. 5 or the SSD 3200 illustrated in FIG. 8.

The network adapter 4100 is configured to provide an interface between the computer system 4000 and external networks. The CPU 4200 is configured to perform overall arithmetic operations for driving an operating system or application programs staying on the RAM 4400.

The data storage device 4300 is configured to store overall data required by the computer system 4000. For example, the operating system for driving the computer system 4000, application programs, various program modules, program data, and user data may be stored in the data storage device 4300.

The RAM 4400 may be used as a working memory device of the computer system 4000. During booting, the operating system, application programs, various program modules, which are read from the data storage device 4300, and program data required for driving the programs are loaded into the RAM 4400. The ROM 4500 stores a basic input/output system (BIOS) which is enabled before the operating system is driven. Through the user interface 4600, information exchange is performed between the computer system 4000 and a user.

Although not illustrated in the drawing, the computer system 4000 may further include a battery, application chipsets, a camera image processor (CIP) and the like.

According to the embodiments of the present invention, since the retention states of the memory cells forming the nonvolatile memory device are provided to the external device, the reliability of the nonvolatile memory device may be improved.

While certain embodiments have been described above, it will be understood to those skilled in the art that the embodiments described are by way of example only. Accordingly, the nonvolatile memory device described herein should not be limited based on the described embodiments. Rather, the nonvolatile memory device described herein should only be limited in light of the claims that follow when taken in conjunction with the above description and accompanying drawings.

What is claimed is:

1. A nonvolatile memory device comprising:
   a memory cell array comprising a main cell area and a retention flag cell area;
   a retention check unit configured to compare a read result for retention flag cells included in the retention flag cell area to a reference value, and determine a retention state of the retention flag cells according to a comparison result; and
   a control logic configured to provide a retention check result based on the retention state to an external device in response to a retention check request provided from the external device.

2. The nonvolatile memory device according to claim 1, wherein the retention check unit is configured to compare a difference value, obtained by subtracting the number of retention flag cells of which the read operations failed when a second retention read voltage was applied from the number of retention flag cells of which the read operations passed when a first retention read voltage was applied, to the reference value.

3. The nonvolatile memory device according to claim 2, wherein when the difference value is larger than the reference value, the retention check unit determines the retention state of the retention flag cells as a fail.

4. The nonvolatile memory device according to claim 2, wherein when the difference value is smaller than the reference value, the retention check unit determines the retention state of the retention flag cells as a pass.

5. The nonvolatile memory device according to claim 2, wherein the first retention read voltage is higher than the second retention read voltage.

6. The nonvolatile memory device according to claim 5, wherein when the retention flag cells are programmed into a first program state, the first retention read voltage is lower than a program verify voltage of the first program state.

7. The nonvolatile memory device according to claim 6, wherein the second retention read voltage is higher than a limit threshold voltage of a second program state which is lower than the first program state.

8. The nonvolatile memory device according to claim 1, wherein the retention flag cell area is included in each memory block forming the main cell area.

9. An operating method of a nonvolatile memory device including main cells and retention flag cells, comprising the steps of:
receiving a retention check request to check a retention state of the retention flag cells;
performing a read operation on the retention flag cells in response to the retention check request;
comparing a number of retention fail bits, calculated on the basis of the result of the performed read operation, to a reference value; and
outputting retention state information based on the comparison to result.

10. The operating method according to claim 9, wherein the step of performing the read operation on the retention flag cells comprises the steps of:
applying a first retention read voltage to the retention flag cells to perform a first read operation; and
applying a second retention read voltage to the retention flag cells to perform a second read operation.

11. The operating method according to claim 10, wherein the step of comparing the number of retention fail bits comprises the step of calculating a difference value, obtained by subtracting the number of retention flag cells of which the read operations failed when the second retention read voltage was applied from the number of retention flag cells of which the read operations passed when the first retention read voltage was applied, as the number of retention fail bits.

12. The operating method according to claim 11, wherein when the number of retention fail bits is larger than the reference value, the retention state information indicating a retention fail is outputted.

13. The operating method according to claim 11, wherein when the number of retention fail bits is smaller than the reference value, the retention state information indicating a retention pass is outputted.

14. The operating method according to claim 10, wherein the first retention read voltage is higher than the second retention read voltage.

15. The operating method according to claim 14, wherein when the retention flag cells are programmed in a first program state, the first retention read voltage is lower than a program verify voltage of the first program state.

16. The operating method according to claim 15, wherein the second retention read voltage is higher than a limit threshold voltage of a second program state which is lower than the first program state.

17. The operating method according to claim 9, further comprising the step of programming retention check data for checking a retention state into the retention flag cells.

18. The operating method according to claim 17, wherein the main cells are programmed while the retention flag cells are being programmed.

19. The operating method according to claim 17, wherein the retention check data comprises a combination of program states of the main cells.

20. The operating method according to claim 18, wherein the retention flag cells may be programmed regardless of whether the main cells are programmed.

* * * * *